United States Patent
Chen et al.

(10) Patent No.: US 11,765,868 B2
(45) Date of Patent: Sep. 19, 2023

(54) SERVER RACK COOLING SYSTEM

(71) Applicant: Quanta Computer Inc., Taoyuan (TW)

(72) Inventors: Chao-Jung Chen, Taoyuan (TW); Yu-Nien Huang, Taoyuan (TW); Kuan-Hsiang Liao, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 457 days.

(21) Appl. No.: 17/070,194

(22) Filed: Oct. 14, 2020

(65) Prior Publication Data

US 2021/0392790 A1    Dec. 16, 2021

Related U.S. Application Data

(60) Provisional application No. 63/039,203, filed on Jun. 15, 2020.

(51) Int. Cl.
| | | |
|---|---|---|
| *G06F 1/16* | (2006.01) |
| *H05K 5/00* | (2006.01) |
| *H05K 7/00* | (2006.01) |
| *H05K 7/20* | (2006.01) |

(52) U.S. Cl.
CPC ..... *H05K 7/20836* (2013.01); *H05K 7/20718* (2013.01)

(58) Field of Classification Search
CPC ........... H05K 7/20836; H05K 7/20718; H05K 7/20827; H05K 7/20818
See application file for complete search history.

(56) References Cited

U.S. PATENT DOCUMENTS

| | | | |
|---|---|---|---|
| 9,288,931 B2* | 3/2016 | Inaba | H05K 7/20818 |
| 2010/0124012 A1* | 5/2010 | Kondo | G06F 1/20 |
| | | | 361/679.47 |
| 2014/0144169 A1* | 5/2014 | Inaba | G06F 1/20 |
| | | | 62/259.2 |
| 2016/0044833 A1* | 2/2016 | Krishnan | H05K 7/203 |
| | | | 165/80.4 |
| 2020/0305312 A1* | 9/2020 | Palmer | H05K 7/20818 |

* cited by examiner

*Primary Examiner* — Anthony M Haughton
(74) *Attorney, Agent, or Firm* — NIXON PEABODY LLP (57) ABSTRACT

A cooling system is disclosed for a server rack holding one or more servers. The cooling system includes a cooling module configured to condition coolant to provide cooling within the server rack. The cooling system further includes at least one evaporator configured to couple to an upstream side of the server rack, relative to airflow through the server rack, and cool the airflow flowing into the server rack with the coolant. The cooling system further includes at least one condenser configured to couple to a downstream side of the server rack, relative to the airflow through the server rack, and cool the coolant after the coolant passes through the at least one evaporator.

20 Claims, 9 Drawing Sheets

SERVER RACK COOLING SYSTEM

CROSS-REFERENCE TO RELATED APPLICATION

This application claims priority under 35 U.S.C. § 119 to U.S. Provisional Application No. 63/039,203, titled "HIGH EFFICIENCY INTEGRATED COOLING SYSTEM," and filed on Jun. 15, 2020. The contents of that application are hereby incorporated by reference in their entirety.

FIELD OF THE INVENTION

The present invention relates to cooling systems, such as cooling systems for server racks.

BACKGROUND

With the need to supply ever increasing amounts of power to servers for powering the various central processing units (CPUs), graphics processing units (GPUs), etc. within the servers, thermal design has become more challenging than ever. The airflow inlet temperature into the servers and the server racks plays a crucial role in cooling performance. As the airflow inlet temperature decreases, the cooling performance of a cooling system increases. However, there has yet to be developed, a compact and/or standalone cooling system that can decrease the airflow inlet temperature at the server rack.

Accordingly, there is a need for a local cooling system that can decrease the airflow inlet temperature at a server rack. Aspects of the present disclosure solve this and other problems.

SUMMARY

According to one embodiment, a cooling system is disclosed for a server rack holding one or more servers. The system includes a cooling module, at least one evaporator, and at least one condenser. The cooling module is configured to condition coolant to provide cooling within the server rack. The at least one evaporator is configured to couple to an upstream side of the server rack, relative to airflow through the server rack, and cool the airflow flowing into the server rack with the coolant. The at least one condenser is configured to couple to a downstream side of the server rack, relative to the airflow through the server rack, and cool the coolant after the coolant passes through the at least one evaporator.

According to one aspect, the system further includes a plurality of fans coupled to the at least one condenser and configured to withdraw the airflow from within the server rack. According to another aspect, the plurality of fans is coupled on a downstream side of the at least one condenser, relative to the airflow through the server rack. According to another aspect, the plurality of fans is coupled on an upstream side of the at least condenser, relative to the airflow through the server rack. According to another aspect, the system includes a plurality of fans coupled to the one or more servers and configured to expel the airflow from within the server rack through the at least one condenser. According to another aspect, the system includes a plurality of fans coupled to the at least one evaporator and configured to inject the airflow into the server rack. According to another aspect, the plurality of fans is coupled on a downstream side of the at least one evaporator, relative to the airflow through the server rack. According to another aspect, the plurality of fans is coupled on an upstream side of the at least one evaporator, relative to the airflow through the server rack. According to another aspect, the system includes a first mount configured to couple to the upstream side of the server rack. The at least one evaporator is configured to couple to the first mount to couple to the server rack. According to another aspect, the at least one evaporator is slidably attached to the first mount such that the at least one evaporator can be moved vertically on the server rack. According to another aspect, the system includes a first mount configured to couple to the downstream side of the server rack. The at least one condenser is configured to couple to the first mount to couple to the server rack. According to another aspect, the at least one condenser is slidably attached to the first mount such that the at least one evaporator can be moved vertically on the server rack. According to another aspect, the cooling module is within the server rack at the bottom. According to another aspect, the one or more servers includes a first server at a bottom of the server rack. The at least one evaporator is a single evaporator coupled to the server rack at the bottom, and the at least one condenser is a single condenser coupled to the server rack at the bottom. According to another aspect, the one or more servers includes a first server at a bottom of the server rack; the at least one evaporator is a single evaporator coupled to the server rack at the top; and the at least one condenser is a single condenser coupled to the server rack at the bottom. According to another aspect, the one or more servers includes a first server at a bottom of the server rack and a second server at a top of the server rack. The at least one evaporator is two evaporators coupled to the server rack at the top and the bottom, and the at least one condenser is a single condenser coupled to the server rack at the bottom. According to another aspect, the one or more servers includes a first server at a bottom of the server rack and a second server at a top of the server rack. The at least one evaporator is two evaporators coupled to the server rack at the top and the bottom, and the at least one condenser is two condensers coupled to the server rack at the top and the bottom.

According to another embodiment, a system is disclosed that includes a server rack holding one or more servers, and a cooling system coupled to the server rack and configured to cool the one or more servers. The system further includes a cooling module configured to condition coolant to provide cooling with the server rack. The cooling system further includes at least one evaporator configured to couple to an upstream side of the server rack, relative to airflow through the server rack, and cool the airflow flowing into the server rack with the coolant. The cooling system further includes at least one condenser configured to couple to a downstream side of the server rack, relative to the airflow through the server rack, and cool the coolant after the coolant passes through the at least one evaporator.

According to one aspect, the system includes one or more fans configured to direct the airflow through the server rack. According to another aspect, the at least one evaporator, the at least one condenser, or both, are configured to be vertically positioned on the server rack according to a location of at least one of the one or more servers.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure, and its advantages and drawings, will be better understood from the following description of embodiments together with reference to the accompanying drawings. These drawings depict only embodiments and are, therefore, not to be considered as limitations on the scope of the various embodiments or claims.

DETAILED DESCRIPTION

The various embodiments are described with reference to the attached figures, where like reference numerals are used throughout the figures to designate similar or equivalent elements. The figures are not drawn to scale, and they are provided merely to illustrate the instant invention. It should be understood that numerous specific details, relationships, and methods are set forth to provide a full understanding. One having ordinary skill in the relevant art, however, will readily recognize that the various embodiments can be practiced without one or more of the specific details, or with other methods. In other instances, well-known structures or operations are not shown in detail to avoid obscuring certain aspects of the various embodiments. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Figure 1:
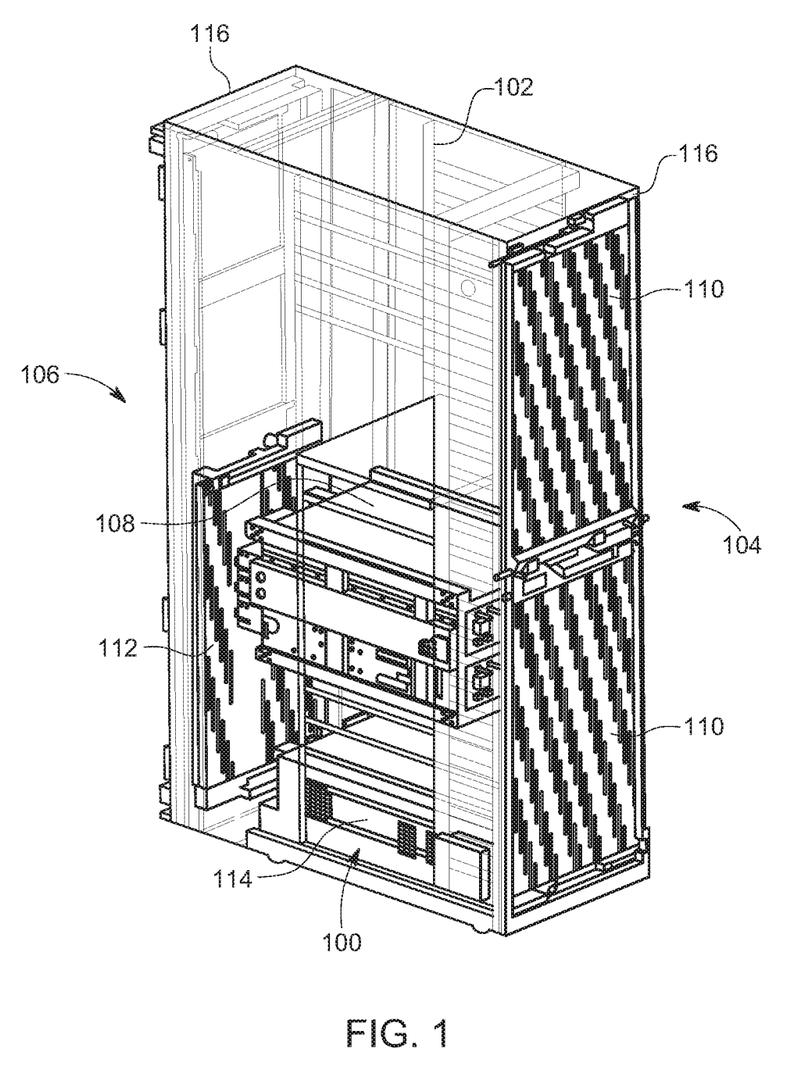
FIG. 1 is a semi-transparent front-side perspective view depicting a cooling system within a server rack, according to aspects of the present disclosure.
Figure 2:
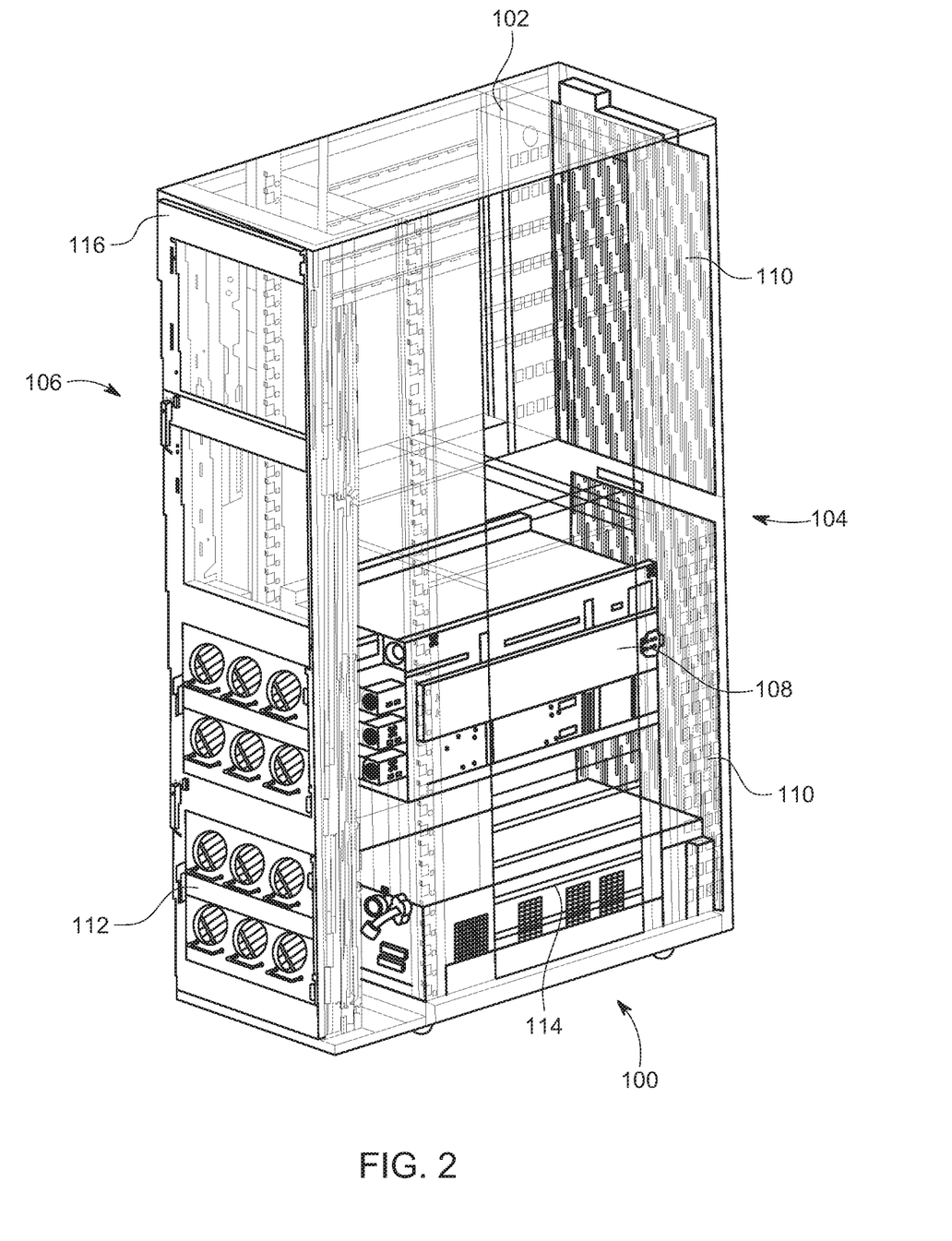
FIG. 2 is a semi-transparent back-side perspective view depicting the cooling system within the server rack, according to aspects of the present disclosure.
Figure 8:
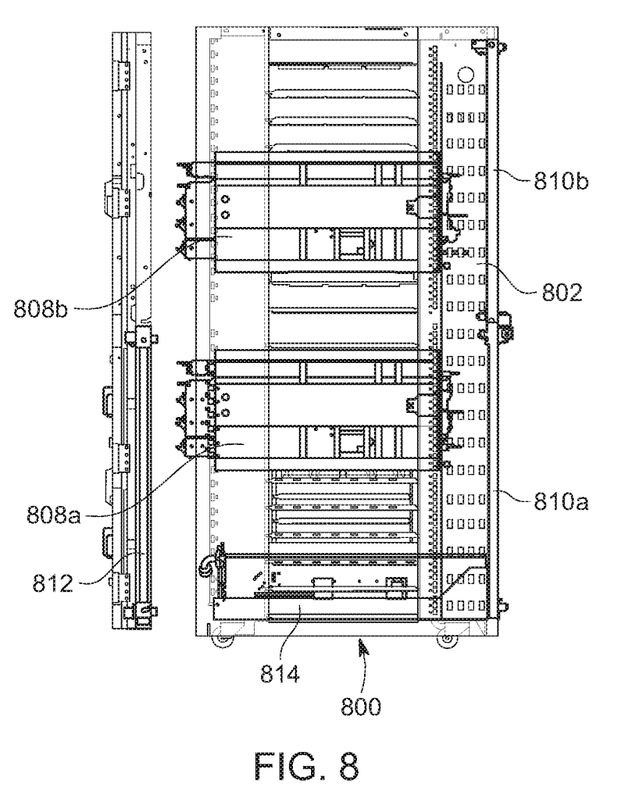
FIG. 8 is a semi-transparent side view of another configuration of a cooling system within a server rack, according to aspects of the present disclosure.
Figure 9:
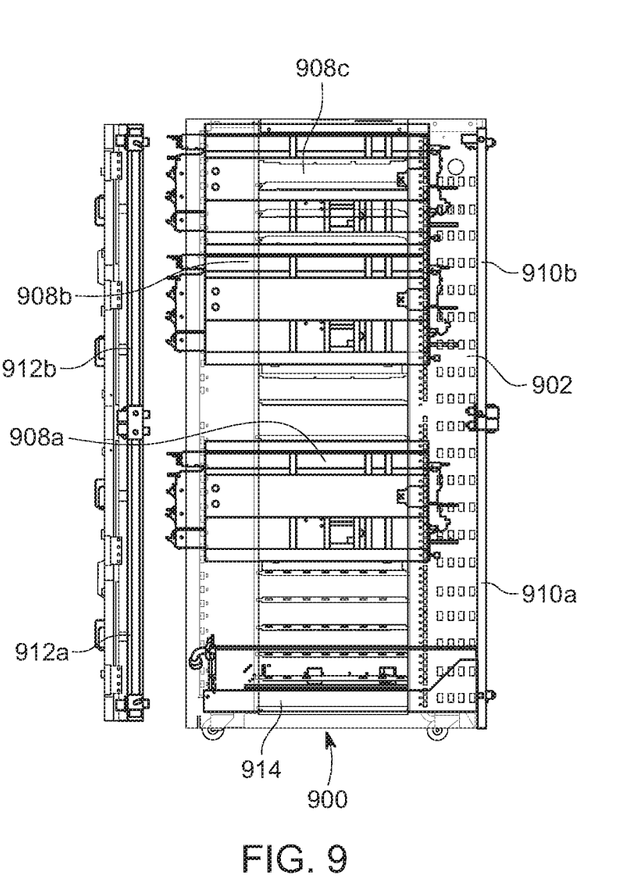
FIG. 9 is a semi-transparent side view of another configuration of a cooling system within a server rack, according to aspects of the present disclosure.

Referring to FIG. 1, a server rack 102 including a cooling system 100 is shown via a semi-transparent front-side perspective view, according to aspects of the present disclosure. FIG. 2 is a semi-transparent back-side perspective view depicting the cooling system 100 within the server rack 102, according to aspects of the present disclosure. Referring to both FIGS. 1 and 2, the cooling system 100 is within and/or attached to the server rack 102. The server rack 102 can be any type or kind of rack that is configured to contain one or more servers. The server rack 102 includes a front side 104 and a back side 106. Within the server rack 102 is a server 108. The server 108 can be any type or kind of server that is configured to be housed within the server rack 102. Although one server 108 is shown, the server rack 102 can include multiple servers 108, as further discussed below (FIGS. 8 and 9).

The cooling system 100 includes two evaporators 110 coupled to the server rack 102 on the front side 104. Although shown generally as being coupled to the outside, the evaporators 110 can be coupled to the server rack 102 on the inside or the outside of the server rack 102. Further, although two evaporators 110 are shown, the cooling system 100 can include one, three, four, or more evaporators 110 depending on, for example, the size of the server rack 102, the size of the evaporators 110, the amount of cooling of the airflow required, etc. The evaporators 110 are configured to cool airflow into the server rack 102 as a result of coolant passing through the evaporators 110, as further discussed below.

The cooling system 100 further includes a condenser 112 (FIG. 2) coupled to the server rack 102 on the back side 106. Although shown generally as being coupled to the outside, the condenser 112 can be coupled to the server rack 102 on the inside or the outside of the server rack 102. Further, although one condenser 112 is shown, the cooling system 100 can include two, three, four, or more condensers 112 depending on, for example, the size of the server rack 102, the size of the condenser 112, the amount of cooling of the airflow required, etc. The condenser 112 is configured to cool the coolant after the coolant passes through one or both of the evaporators 110, as discussed further below.

The cooling system 100 further includes a cooling module 114. The cooling module 114 can be located inside the server rack 102 at the bottom. Alternatively, the cooling module 114 can be located outside of the server rack 102 at the bottom (i.e., underneath the server rack 102), on the top (inside or outside) of the server rack 102, or various other locations on or within the server rack 102. Although one cooling module 114 is shown, the cooling system 100 can include two, three, four, or more cooling modules 114 depending on, for example, the size of the server rack 102, the size of the cooling module 114, the amount of cooling of the airflow required, etc. For example, a single cooling module 114 can cool one server 108 per server rack 102, or a single cooling module 114 can cool multiple servers 108 per server rack 102. Further, in one or more embodiments, a single cooling module 114 can be configured to provide the cooling for multiple server racks 102, such as the server rack 102 that the cooling module 114 is within, and one or more server racks 102 adjacent to or near the server rack 102 that the cooling module 114 is within. In which case, the cooling module 114 can connect to the evaporators 110 and condensers 112 within the server racks 102 surrounding the server rack 102 housing the cooling module 114.

The cooling module 114 is configured to condition the coolant that passes through the evaporators 110 and the condenser 112 to provide cooling. The cooling module 114 conditions the coolant according to a typical air conditioning process cycle. For example, the cooling module 114 includes one or more expansion valves, one or more driers, and one or more compressors for conditioning the coolant so that the coolant can cool airflow into the server rack 102 at the evaporators 110.

The cooling system 100 further includes one or more coolant lines (not shown) for conveying the coolant between the evaporators 110, the condenser 112, and the cooling module 114.

In one or more embodiments, the condenser 112 can couple directly to the server rack 102 on existing structure of the server rack 102. Alternatively, and as shown in FIG. 2, in one or more embodiments, a mount 116 can be added to couple the condenser 112 to the server rack 102. In one or more embodiments, the evaporators 110 and/or the condenser 112 can couple to a mount 116 and/or be housed within a mount 116, as shown in FIG. 2 for the condenser 112.

In one or more embodiments, the mount 116 can be configured to allow the evaporators 110 and/or condenser 112 to move vertically up and down relative to the server rack 102. The vertical movement allows the evaporators 110 and/or condenser 112 to be positioned on the server rack 102 at vertical locations that align with the server (or servers) 108 within the server rack 102, the other of the evaporators 110 or condenser 112 on the opposite side of the server rack 102, or both. For example, as the cooling requirement changes within the server rack 102 in response to, for example, a change in the placement of the server 108 within the server rack 102, the position of the evaporators 110 and/or condenser 112 can be changed to align with the new arrangement of the server 108.

Figure 3:
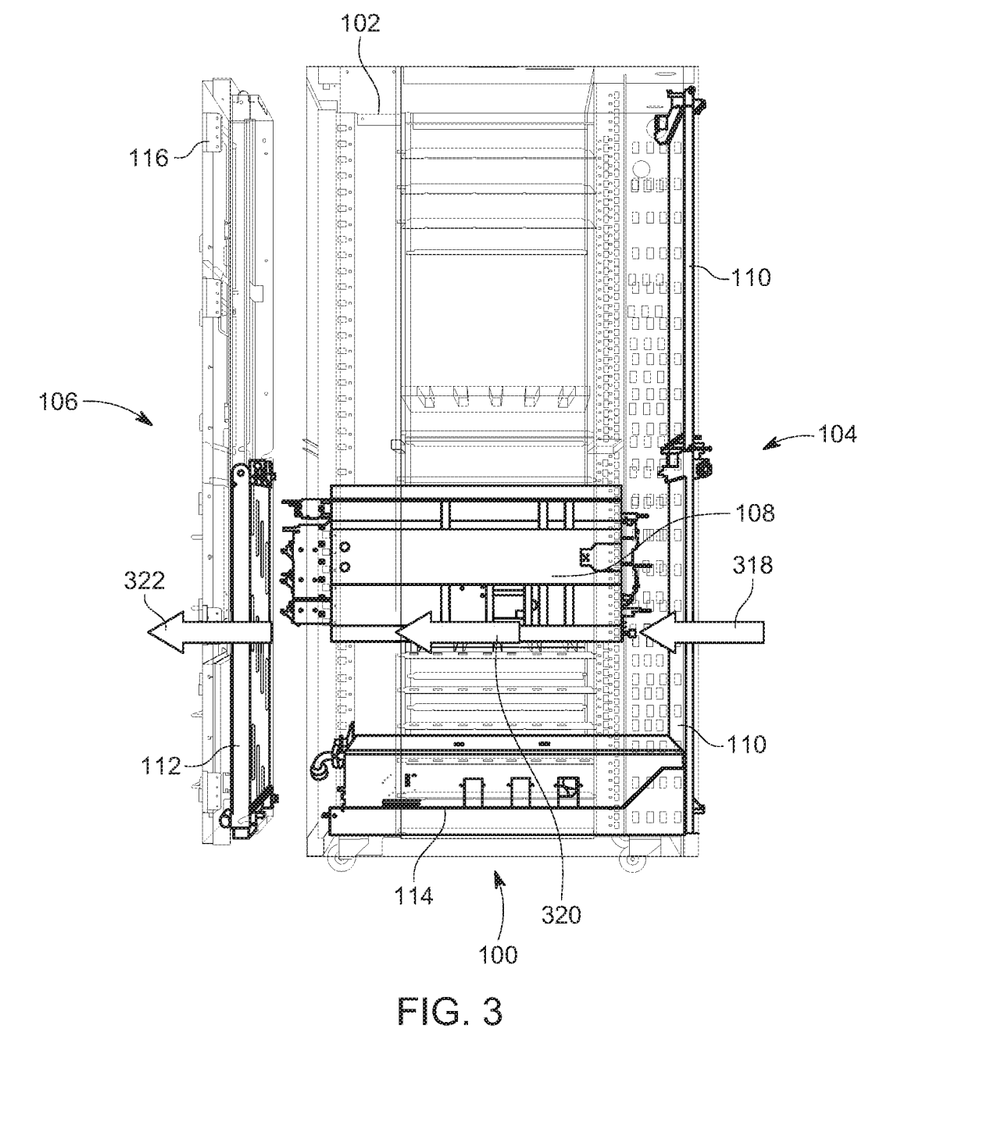
FIG. 3 is a semi-transparent side view of the cooling system within the server rack, according to aspects of the present disclosure.

FIG. 3 is a semi-transparent side view of the cooling system 100 within the server rack 102, according to aspects of the present disclosure. The incoming airflow (designated by arrow 318) travels through the evaporators 110 at the front side 104 of the server rack 102. As the incoming airflow 318 passes through the evaporators 110, the coolant in the evaporators 110 cools the airflow 318.

Within the server rack 102, the internal airflow (designated by arrow 320) passes over and/or through the server 108. Heat transfers from the server 108 to the internal airflow 320 based, at least in part, on the internal airflow 320 having been cooled by the coolant within the evaporators 110. The internal airflow 320 therefore cools the server 108. Moreover, the internal airflow 320 cools the server 108 more than it would have had it not passed through and been cooled by the evaporators 110.

After passing through and around the server 108, outgoing heated airflow (designated by arrow 322) then passes out of the server rack 102 and through the condenser 112. The outgoing heated airflow 322 mixes with heat emitted by the condenser 112 as part of the conditioning of the coolant, as discussed above.

Cooling the incoming airflow 318 as it enters the server rack 102 with the evaporators 110 can maximize the amount of cooling provided by the internal airflow 320 within the server rack 102. The improved cooling can improve the performance of the server 108.

Figure 4:
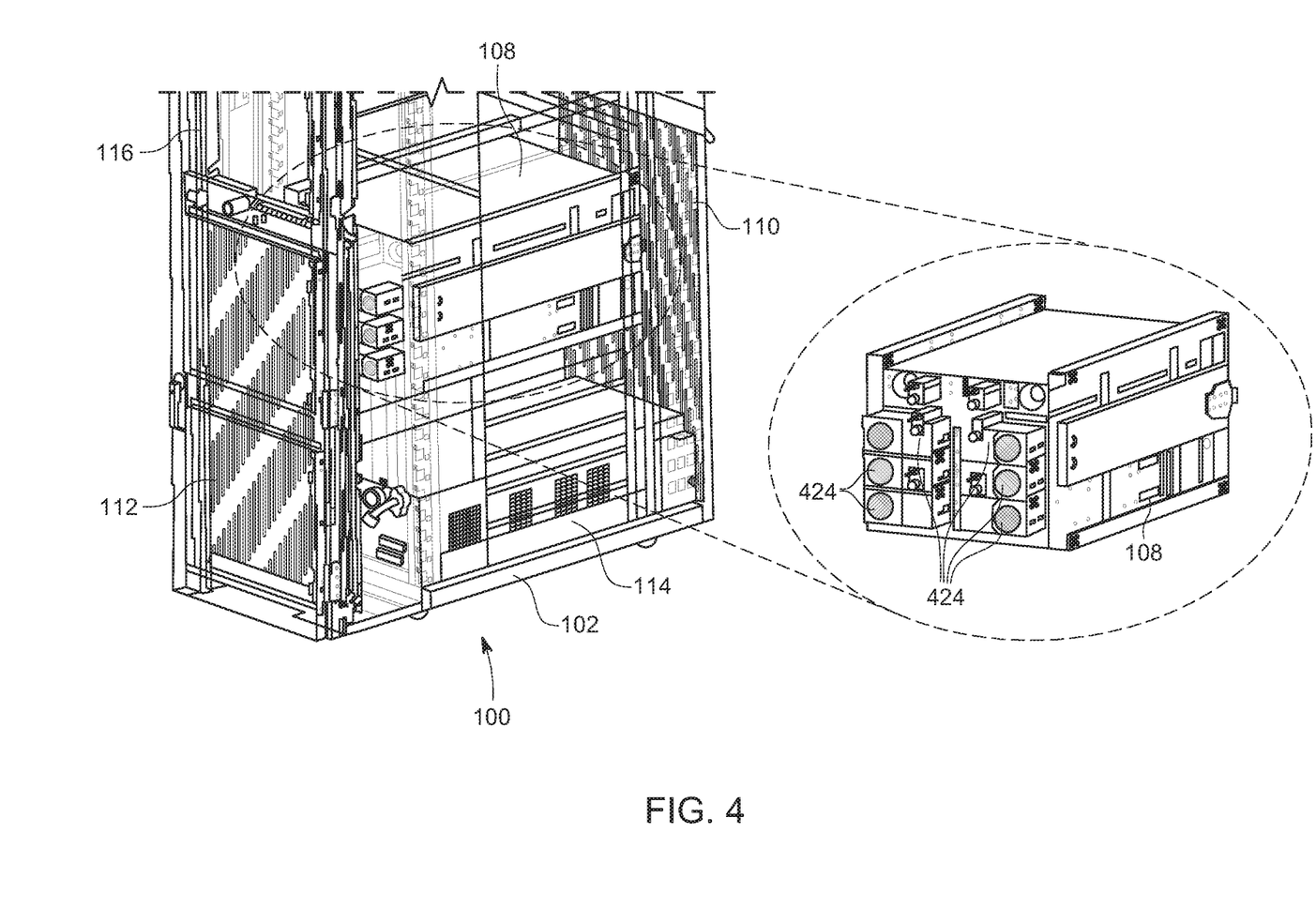
FIG. 4 is a semi-transparent partial back-side perspective view of the server rack and cooling system, according to aspects of the present disclosure.

FIG. 4 illustrates a semi-transparent partial perspective view of the server rack 102 and cooling system 100, according to aspects of the present disclosure. The server 108 can include one or more fans 424. The fans 424 are configured to move air through the server 108 for cooling the server 108 and components therein (not shown). In one or more embodiments, the fans 424 can cause the airflow 318-322 through the evaporators 110, server rack 102, and condenser 112 described above (FIG. 3). The fans 424 can direct the internal airflow 320 out of the server rack 102 and through the condenser 112.

Figure 5:
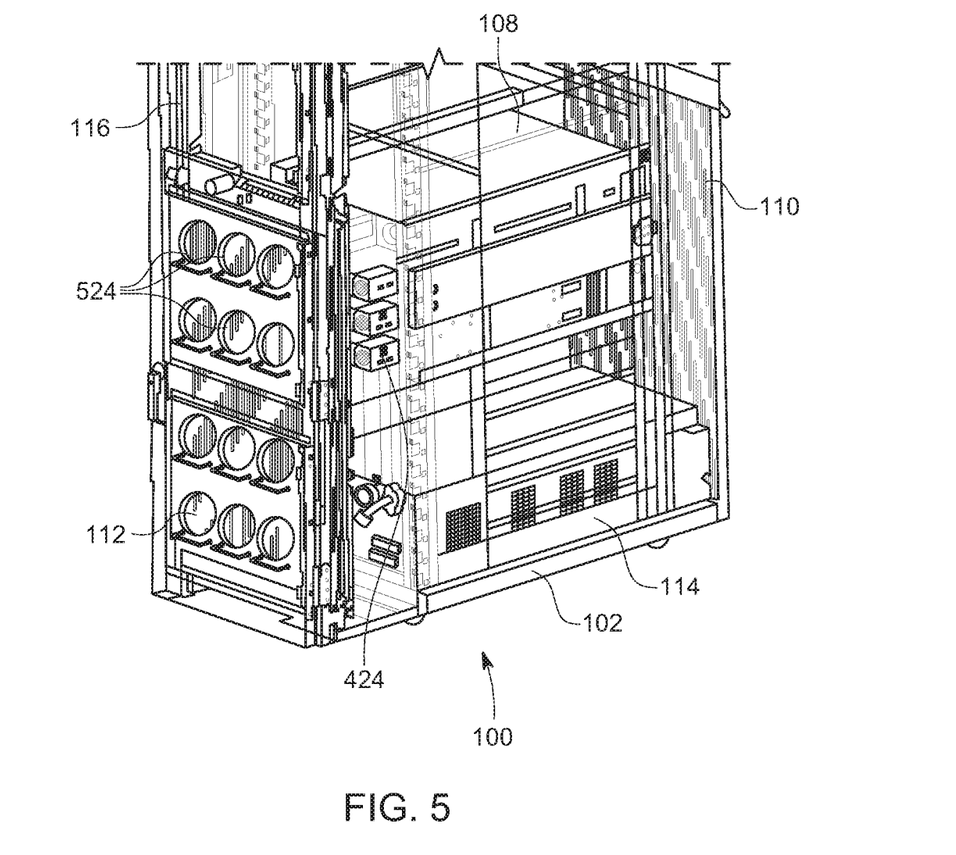
FIG. 5 is a semi-transparent particle back-side perspective view of the server rack and cooling system, according to aspects of the present disclosure.

Alternatively, FIG. 5 illustrates a partial semi-transparent perspective view of the server rack 102 and cooling system 100, according to aspects of the present disclosure, with another fan arrangement. Specifically, one or more fans 524 can be positioned on the condenser 112 and configured to move the airflow 318-322 through the server rack 102. The fans 524 can be on the inside or outside (as shown in FIG. 5) of the condenser 112 relative to the server rack 102. The fans 524 can be used in place of the fans 424 of the server 108 (FIG. 4). Alternatively, and as shown in FIG. 5, the fans 524 can be in addition to the fans 424 of the server 108. Although not shown, the fans 524 can alternatively, or in addition, be on one or more of the evaporators 110. In one or more embodiments, the fans 524 can be configured to be coupled to the mount 116, and the mount 116 can be configure to accept the fans 524. The fans 524 within the mount 116 can further be configured to vertically move within the mount 116.

As discussed above, the cooling systems of the present disclosure can have various configurations depending on the size, arrangement, etc., of the server rack and locations of the servers within the server rack. FIGS. 6-9 show various possible configurations of a cooling system within a server rack, according to aspects of the present disclosure. Element numbers ending in tens and ones discussed in FIGS. 6-9 correspond with the same digits discussed above for FIGS. 1-5. For example, the cooling system 600 and the server rack 602 are similar to the cooling system 100 and the server rack 102, respectively, as discussed above for FIG. 1. For convenience, redundant descriptions of these components are not provided below.

Figure 6:
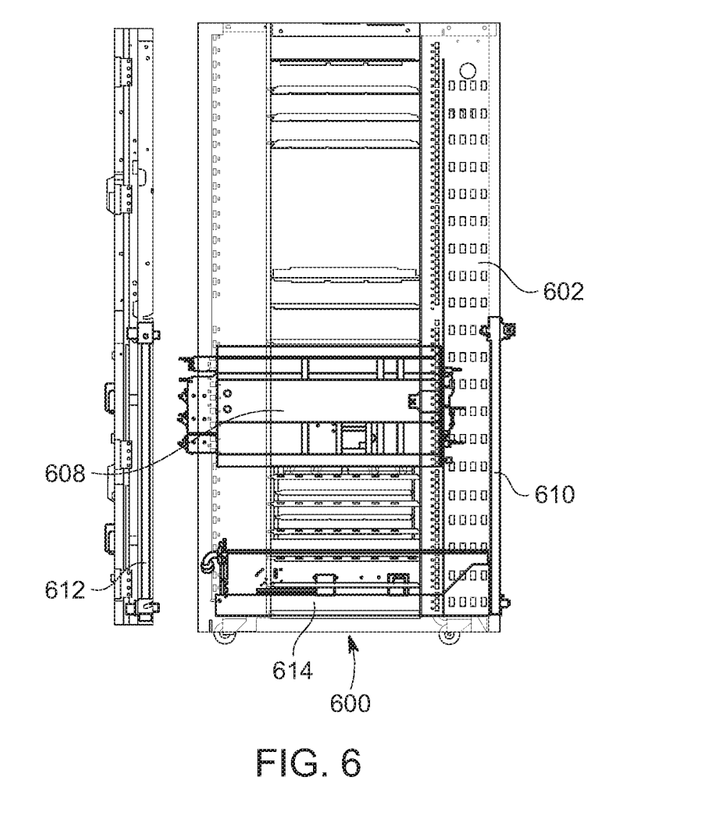
FIG. 6 is a semi-transparent side view of a configuration of a cooling system within a server rack, according to aspects of the present disclosure.

Referring to FIG. 6, the server rack 602 includes a cooling system 600 with a cooling module 614. The cooling system 600 further includes an evaporator 610 and a condenser 612 on opposite sides of a server 608 within the server rack 102. Thus, the arrangement in FIG. 6 is similar to the arrangement of FIGS. 1-5 except for the omission of one evaporator.

Figure 7:
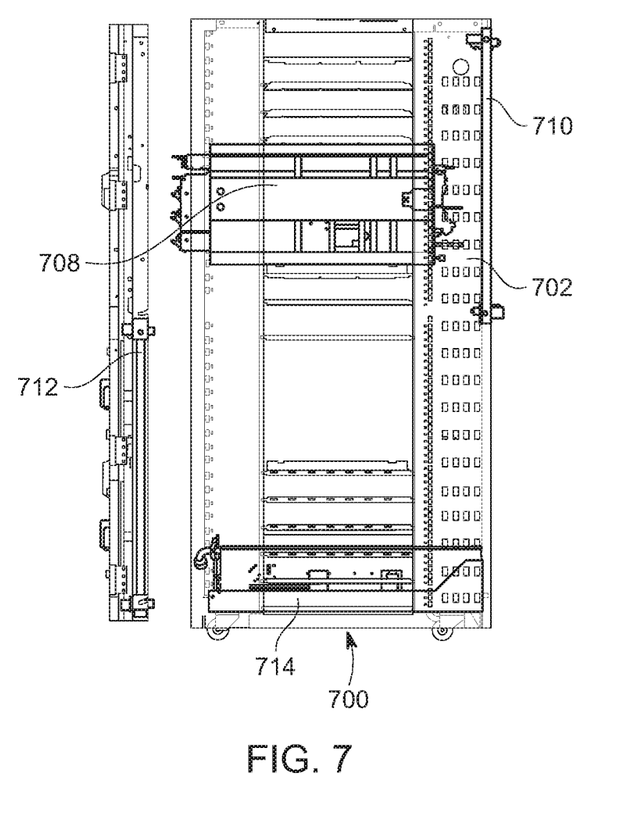
FIG. 7 is a semi-transparent side view of another configuration of a cooling system within a server rack, according to aspects of the present disclosure.

Referring to FIG. 7, the server rack 702 includes a cooling system 700 with a cooling module 714. The cooling system 700 further includes an evaporator 710 and a condenser 712. The evaporator 710 is positioned at the top of the server rack 702 and vertically aligned with the server 708. Further, the condenser 712 is positioned at the bottom of the server rack 702. Airflow can travel into the server rack 702 through the evaporator 710 at the top of the server rack 702. The airflow can then travel through and/or across the server 708 as the airflow proceeds down within the server rack 702. At the bottom of the server rack 702, the airflow can then flow out of the server rack 702.

Referring to FIG. 8, the server rack 802 includes a pair of servers 808a and 808b. The server rack 802 further includes a cooling system 800 with a cooling module 814, a pair of evaporators 810a and 810b, and a condenser 812. The evaporators 810a and 810b are positioned on the opposite side of the server rack 802 than the condenser 812. The server 808a is between the set of evaporator 810a and condenser 812a, and the server 808b is above the server 808a, adjacent to the evaporator 810b. Thus, where there are multiple servers within a server rack, each server can have its own evaporator, and the servers can share the same condenser. Alternatively, there can be multiple condensers and a single evaporator. In which case, each server can have its own condenser, and the servers can share the same evaporator.

Referring to FIG. 9, the server rack 902 includes three servers 908a-908c. The server rack 902 further includes a cooling system 900 with a cooling module 914, a pair of evaporators 910a and 910b, and a pair of condensers 912a and 912b. The evaporators 910a and 910b are positioned on the opposite side of the server rack 902 than the condensers 912a and 912b. The server 908a is between the set of evaporator 910a and condenser 912a, and the servers 908b and 908c are between the set of evaporator 910b and condenser 912b. Thus, where there are multiple servers within a server rack, each server can have its own set of evaporator and condenser, or multiple servers can share the same set of evaporator and condenser.

While various embodiments of the present invention have been described above, it should be understood that they have been presented by way of example only, and not limitation. Numerous changes to the disclosed embodiments can be made in accordance with the disclosure herein without departing from the spirit or scope. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A cooling system for a server rack holding one or more servers, the server rack including a front, upstream side and a back, downstream side, opposite the upstream side, relative to airflow through the server rack, the system comprising:

a cooling module configured to condition coolant to provide cooling with the server rack;

at least one evaporator configured to couple to the upstream side of the server rack, such that the at least one evaporator is arranged perpendicularly relative to the airflow flowing through the at least one evaporator, and cool the airflow flowing through the at least one evaporator and into the server rack with the coolant; and at least one condenser configured to couple to the downstream side of the server rack, such that the at least one condenser is arranged perpendicularly relative to the airflow flowing through the at least one condenser, and cool the coolant after the coolant passes through the at least one evaporator.

2. The cooling system of claim 1, further comprising:
a plurality of fans coupled to the at least one condenser and configured to withdraw the airflow from within the server rack.

3. The cooling system of claim 2, wherein the plurality of fans is coupled on a downstream side of the at least one condenser, relative to the airflow through the server rack.

4. The cooling system of claim 2, wherein the plurality of fans is coupled on an upstream side of the at least one condenser, relative to the airflow through the server rack.

5. The cooling system of claim 1, further comprising:
a plurality of fans coupled to the one or more servers and configured to expel the airflow from within the server rack through the at least one condenser.

6. The cooling system of claim 1, further comprising:
a plurality of fans coupled to the at least one evaporator and configured to inject the airflow into the server rack.

7. The cooling system of claim 6, wherein the plurality of fans is coupled on a downstream side of the at least one evaporator, relative to the airflow through the server rack.

8. The cooling system of claim 6, wherein the plurality of fans is coupled on an upstream side of the at least one evaporator, relative to the airflow through the server rack.

9. The cooling system of claim 1, further comprising:
a first mount configured to couple to the upstream side of the server rack,
wherein the at least one evaporator is configured to couple to the first mount to couple to the server rack.

10. The cooling system of claim 9, wherein the at least one evaporator is slidably attached to the first mount such that the at least one evaporator can be moved vertically on the server rack.

11. The cooling system of claim 1, further comprising:
a first mount configured to couple to the downstream side of the server rack,
wherein the at least one condenser is configured to couple to the first mount to couple to the server rack.

12. The cooling system of claim 11, wherein the at least one condenser is slidably attached to the first mount such that the at least one evaporator can be moved vertically on the server rack.

13. The cooling system of claim 1, wherein the cooling module is within the server rack at the bottom.

14. The cooling system of claim 1, wherein the one or more servers includes a first server at a bottom of the server rack, the at least one evaporator is a single evaporator coupled to the server rack at the bottom, and the at least one condenser is a single condenser coupled to the server rack at the bottom.

15. The cooling system of claim 1, wherein the one or more servers includes a first server at a bottom of the server rack, the at least one evaporator is a single evaporator coupled to the server rack at the top, and the at least one condenser is a single condenser coupled to the server rack at the bottom.

16. The cooling system of claim 1, wherein the one or more servers includes a first server at a bottom of the server rack and a second server at a top of the server rack, the at least one evaporator is two evaporators coupled to the server rack at the top and the bottom, and the at least one condenser is a single condenser coupled to the server rack at the bottom.

17. The cooling system of claim 1, wherein the one or more servers includes a first server at a bottom of the server rack and a second server at a top of the server rack, the at least one evaporator is two evaporators coupled to the server rack at the top and the bottom, and the at least one condenser is two condensers coupled to the server rack at the top and the bottom.

18. A system comprising:
 a server rack holding one or more servers, the server rack including a front, upstream side and a back, downstream side, opposite the upstream side, relative to airflow through the server rack; and
 a cooling system coupled to the server rack for cooling the one or more servers, the cooling system including:
  a cooling module configured to condition coolant to provide cooling with the server rack;
  at least one evaporator configured to couple to the upstream side of the server rack, such that the at least one evaporator is arranged perpendicularly relative to the airflow flowing through the at least one evaporator, and cool the airflow flowing through the at least one evaporator and into the server rack with the coolant; and
  at least one condenser configured to couple to the downstream side of the server rack, such that the at least one condenser is arranged perpendicularly relative to the airflow flowing through the at least one condenser, and cool the coolant after the coolant passes through the at least one evaporator.

19. The system of claim 18, further comprising one or more fans configured to direct the airflow through the server rack.

20. The system of claim 18, wherein the at least one evaporator, the at least one condenser, or both are configured to be vertically positioned on the server rack according to a location of at least one of the one or more servers.

* * * * *